(12) United States Patent
Sun et al.

(10) Patent No.: US 11,349,448 B2
(45) Date of Patent: May 31, 2022

(54) HARMONIC FILTERING FOR HIGH POWER RADIO FREQUENCY (RF) COMMUNICATIONS

(71) Applicant: Silicon Laboratories Inc., Austin, TX (US)

(72) Inventors: Ruifeng Sun, Charlottesville, VA (US); Francesco Barale, North Kingstown, RI (US); Vinod Jayakumar, Austin, TX (US); Sherry Xiaohong Wu, Austin, TX (US); Mustafa H. Koroglu, Austin, TX (US); Essam S. Atalla, Round Rock, TX (US)

(73) Assignee: Silicon Laboratories Inc., Austin, TX (US)

( * ) Notice: Subject to any disclaimer, the term of this patent is extended or adjusted under 35 U.S.C. 154(b) by 152 days.

(21) Appl. No.: 16/586,153

(22) Filed: Sep. 27, 2019

(65) Prior Publication Data

US 2021/0099148 A1 Apr. 1, 2021

(51) Int. Cl.
*H03F 3/24* (2006.01)
*H03H 7/01* (2006.01)
*H04B 1/40* (2015.01)

(52) U.S. Cl.
CPC .......... *H03H 7/0115* (2013.01); *H03F 3/245* (2013.01); *H03F 2200/171* (2013.01);
(Continued)

(58) Field of Classification Search
CPC . H03H 7/0115; H03F 3/245; H03F 2200/294; H03F 2200/451; H03F 2200/171; H04B 1/40
(Continued)

(56) References Cited

U.S. PATENT DOCUMENTS

| 5,375,256 A | 12/1994 | Yokoyama et al. |
| 6,735,418 B1 | 5/2004 | MacNally et al. |

(Continued)

FOREIGN PATENT DOCUMENTS

| CN | 102438389 | 5/2012 |
| CN | 102792599 | 11/2012 |

(Continued)

OTHER PUBLICATIONS

Atalla et al., "On-Chip Harmonic Filtering for Radio Frequency (RF) Communications", U.S. Appl. No. 16/846,520, filed Apr. 13, 2020, Response to Office Action dated Sep. 16, 2020, 8 pgs.

(Continued)

*Primary Examiner* — Khanh V Nguyen
*Assistant Examiner* — Khiem D Nguyen
(74) *Attorney, Agent, or Firm* — Egan, Enders & Huston LLP.

(57) ABSTRACT

Systems and methods are disclosed for on-chip harmonic filtering for radio frequency (RF) communications. For disclosed embodiments, a filter circuit is coupled between a first internal node and a connection pad for an integrated circuit. The filter circuit includes a first inductance, a variable capacitance, and a second inductance. The capacitance amount for the variable capacitance is controlled to tune filtering for the filter circuit to a harmonic of a frequency for a transmit output signal. A power amplifier outputs the transmit output signal to the connection pad without passing through the filter circuit. The filter circuit filters the harmonic of the frequency for the transmit output signal, shunting harmonic current to ground. For one embodiment, the filtered harmonic is a third harmonic of the transmit frequency. For one embodiment, the transmit output signal has an output power greater than or equal to 15 dBm.

20 Claims, 5 Drawing Sheets

(52) U.S. Cl.
CPC .. *H03F 2200/294* (2013.01); *H03F 2200/451* (2013.01); *H04B 1/40* (2013.01)

(58) Field of Classification Search
USPC .................................. 330/307, 302, 306, 296
See application file for complete search history.

(56) References Cited

U.S. PATENT DOCUMENTS

| | | | |
|---|---|---|---|
| 7,009,455 | B2 | 3/2006 | Toncich et al. |
| 7,671,693 | B2 | 3/2010 | Brobston et al. |
| 8,542,078 | B2 | 9/2013 | De Jongh et al. |
| 8,975,981 | B2 | 3/2015 | See et al. |
| 9,042,844 | B2 * | 5/2015 | Yu .......................... H04B 1/44 455/83 |
| 9,431,990 | B2 | 8/2016 | Du Toit et al. |
| 9,608,591 | B2 | 3/2017 | Manssen et al. |
| 10,141,971 | B1 * | 11/2018 | Elkholy ................... H04B 1/18 |
| 10,658,999 | B1 | 5/2020 | Atalla et al. |
| 2008/0094149 | A1 | 4/2008 | Brobston |
| 2009/0017775 | A1 * | 1/2009 | Qiao ........................ H04B 1/44 455/78 |
| 2010/0308933 | A1 | 12/2010 | See et al. |
| 2012/0075033 | A1 | 3/2012 | Ouyang et al. |
| 2013/0063223 | A1 | 3/2013 | See et al. |
| 2016/0020818 | A1 | 1/2016 | Chee et al. |
| 2016/0127063 | A1 | 5/2016 | Leipold et al. |

FOREIGN PATENT DOCUMENTS

| | | |
|---|---|---|
| CN | 104067514 | 9/2014 |
| CN | 105210291 | 12/2015 |
| CN | 109787569 | 5/2019 |

OTHER PUBLICATIONS

Atalla et al., "On-Chip Harmonic Filtering for Radio Frequency (RF) Communications", U.S. Appl. No. 16/846,520, filed Apr. 13, 2020, Final Office Action dated Nov. 13, 2020, 9 pgs.

"Office Action dated Oct. 16, 2019," U.S. Appl. No. 16/506,409, 12 pages.

"Response to Office Action dated Oct. 16, 2019," U.S. Appl. No. 16/506,409, dated Jan. 16, 2020, 8 pages.

Atalla et al., "On-Chip Harmonic Filtering for Radio Frequency (RF) Communications", U.S. Appl. No. 16/846,520, filed Apr. 13, 2020, 25 pgs.

Atalla et al., "On-Chip Harmonic Filtering for Radio Frequency (RF) Communications", U.S. Appl. No. 16/846,520, filed Apr. 13, 2020, Office Action dated Jul. 22, 2020, 11 pgs.

Atalla et al., "On Chip Harmonic Filtering for Radio Frequency (RF) Communications", filed Jul. 9, 2019, U.S. Appl. No. 16/506,409, Final office action dated Mar. 17, 2020, 7 pgs.

Atalla et al., "On Chip Harmonic Filtering for Radio Frequency (RF) Communications", filed Jul. 9, 2019, U.S. Appl. No. 16/506,409, Response to Final office action filed Mar. 30, 2020, 7 pgs.

Atalla et al., "On-Chip Harmonic Filtering for Radio Frequency (RF) Communications", U.S. Appl. No. 16/846,520, filed Apr. 13, 2020, Response to Final Office Action dated Dec. 11, 2020, 11 pgs.

Liu, et al. "A 1.9nJ/b 2.4GHz Multistandard (Bluetooth Low Energy/Zigbee/IEEE802.15.6) Transceiver for Personal/Body-Area Networks," IEEE International Solid-State Circuits Conference, 3 pgs. (2013).

Liu, et al., "A 3.7mW-RX 4.4mW-TX Fully Integrated Bluetooth Low Energy/IEEE802.15.4) Proprietary SoC With an ADPLL-Based Fast Frequency Offset Compensation in 40nm CMOS," IEEE International Solid-State Circuits Conference, 3 pgs. (2015).

Prummel, et al., "A 10mW Bluetooth Low-Energy Transceiver With On-Chip Matching," IEEE International Solid-State Circuits Conference, 3 pgs. (2015).

Sano, et al., "A 6.3mW BLE Transceiver Embedded RX Image-Rejection Filter and TX Harmonic-Suppression Filter Reusing On-Chip Matching Network," IEEE International Solid-State Circuits Conference, 3 pgs. (2015).

Kuo et al., "A Fully Integrated 28nm Bluetooth Low-Energy Transmitter With 36% System Efficiency at 3dBm," IEEE, 4 pgs. (2015).

Ba, et al., "A 2.4GHz Class-D Power Amplifier with Conduction Angle Calibration for −50dBc Harmonic Emissions," IEEE, 4 pages (2014).

Fritzin, et al., "Design and Analysis of a Class-D Stage with Harmonic Suppression," IEEE Transactions on Circuits and Systems I: Regular Papers, vol. 59, issue 6, 10 pgs (Jun. 2012).

Atalla et al., "On-Chip Harmonic Filtering for Radio Frequency (RF) Communications", U.S. Appl. No. 16/506,409, filed Jul. 9, 2019, 24 pgs.

* cited by examiner

HARMONIC FILTERING FOR HIGH POWER RADIO FREQUENCY (RF) COMMUNICATIONS

TECHNICAL FIELD

The technical field relates to wireless radio frequency (RF) communications and more particularly to harmonic filtering of RF communications.

BACKGROUND

Wireless radio frequency (RF) devices often include integrated circuits (ICs) that operate to receive RF input signals, transmit RF output signals, or both receive and transmit RF signals. Where receive functionality is included, RF communication ICs typically receive analog signals from antennas and convert the analog signals to digital data. Where transmit functionality is included, RF communication ICs typically convert digital data to analog output signals and transmit these analog output signals through power amplifiers to antennas. To increase or maximize power transfer from antennas during receive modes, matching circuits can be used so that the input impedance matches the impedance of the antenna during reception. To increase or maximize power transfer to antennas during transmit modes, matching circuits can also be used so that the output impedance matches the impedance of the antenna during transmit. Configurable matching circuits have been included on-chip to provide this impedance matching.

Figure 1:
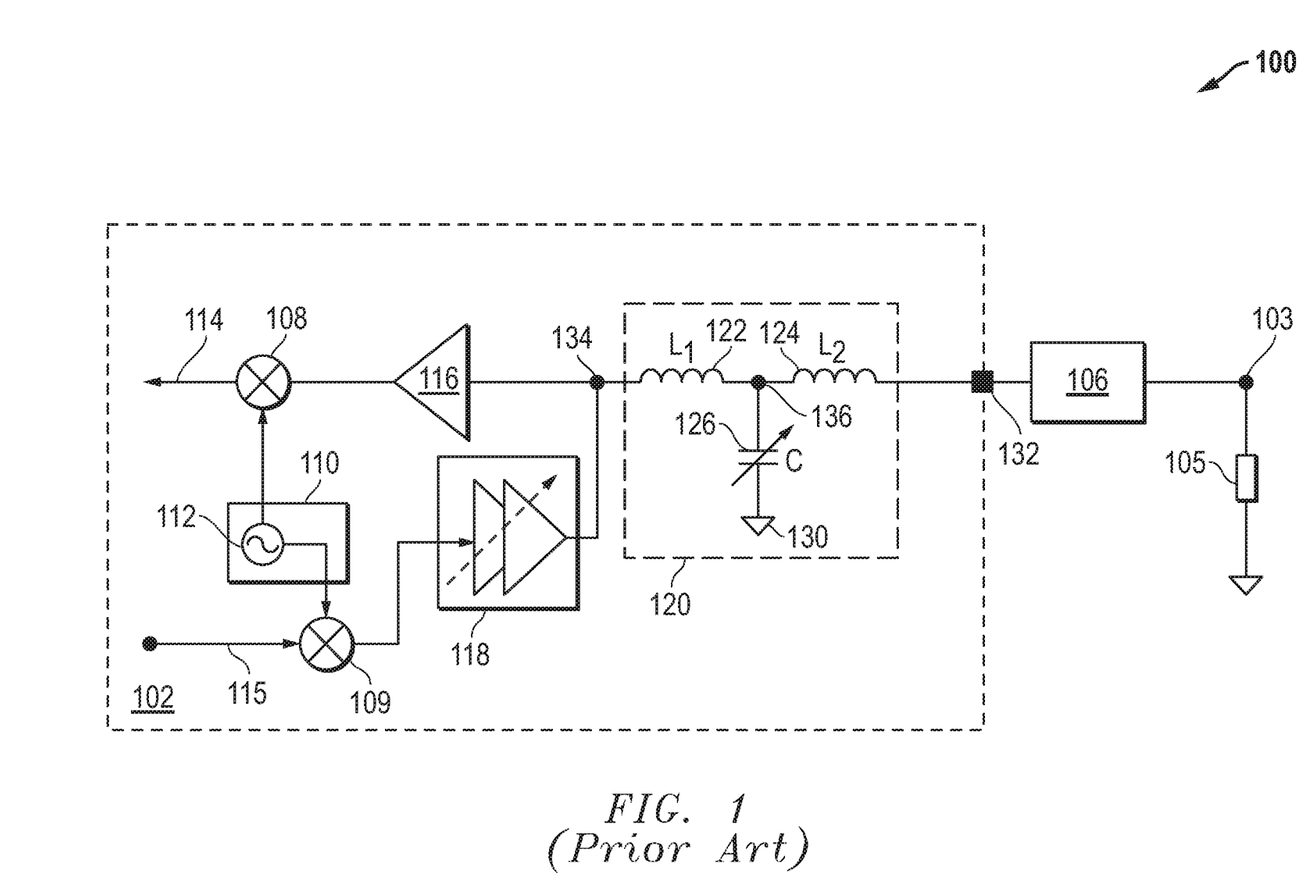
FIG. 1 (Prior Art) is a circuit diagram of an example embodiment that includes an off-chip harmonic rejection filter and an on-chip matching network that is configurable based upon a variable capacitance.

FIG. 1 (Prior Art) is a circuit diagram of an example embodiment 100 that includes an on-chip matching network 120 that is configurable based upon a variable capacitance 126. The integrated circuit 102 includes a receive mixer 108, a low noise amplifier (LNA) 116, a frequency synthesizer 110 including a controlled oscillator 112, a transmit mixer 109, a power amplifier 118, and a matching network 120. As described further below with respect to the transmit path, direct modulation of an output frequency from the frequency synthesizer 110 can also be used instead of a transmit mixer 109. A harmonic rejection filter 106 is coupled off-chip between the connection pad 132 and an input/output node 103. It is also noted that for some prior solutions, the matching network 120 is also included off-chip, and one off-chip circuit block can be used to provide both a matching function and a harmonic rejection function. The input/output node 103 is coupled to an antenna, which is represented by load 105. One common impedance for an antenna is 50 Ohms, although other antenna impedances can also be used. The integrated circuit 102 includes a receive path and a transmit path.

For the receive path, an RF input signal is received at the antenna or load 105 and is provided to connection pad 132 through the off-chip harmonic rejection filter 106. The receive signal then passes through the matching network 120 and the low noise amplifier 116 before being down-converted to a lower frequency by the receive mixer 108. The receive mixer 108 receives a local-oscillator mixing signal from the on-chip frequency synthesizer 110, which includes the controlled oscillator 112. The down-converted RF input signal 114 is then further processed by circuitry within the integrated circuit 102. For example, the down-converted RF input signal 114 can be converted to digital values by an analog-to-digital converter and then processed by digital processing circuitry within the integrated circuit 102.

For the transmit path, an analog output signal 115 is received by the power amplifier 118 through the transmit mixer 109. This analog output signal 115 can be, for example, an output from a digital-to-analog converter that receives a digital signal generated by digital processing circuitry within the integrated circuit 102. The transmit mixer 109 receives a local-oscillator mixing signal from the on-chip frequency synthesizer 110, which includes the controlled oscillator 112. The transmit mixer 109 up-converts the analog output signal 115 to an RF output signal at a desired transmit frequency. This up-converted RF output signal is provided to power amplifier 118, which can be programmable to generate a transmit output signal at a desired power level. It is also noted that the direct modulation can also be used where the local oscillator signal from frequency synthesizer 110 is modulated with the transmit data and then fed directly into the power amplifier 118. The transmit output signal is passed through the matching network 120 and the connection pad 132 to the harmonic rejection filter 106 before being transmitted through the antenna or load 105.

The configurable matching network 120 can be implemented using a first inductance 122, a second inductance 124, and a variable capacitance 126. The variable capacitance 126 is controlled to provide matching for the input and/or output impedances. For the embodiment depicted, the first inductor (L1) 122 is coupled between node 134 and node 136, and the second inductor (L2) 124 is coupled between node 136 and the pad 132. The variable capacitance (C) 126 is coupled between node 136 and ground 130 and can be controlled, for example, with an on-chip controller. During operation, the configurable matching network 120 is controlled to provide impedance matching. U.S. Pat. No. 10,141,971 describes embodiments that provide on-chip configurable matching networks, and U.S. Pat. No. 10,141,971 is hereby incorporated by reference in its entirety.

High-efficiency power amplifiers (PAs) for constant-envelope modulation schemes, such as BLE (Bluetooth Low Energy) and IEEE 802.15.4 based LR-WPANs (low-rate wireless personal area networks), typically trade-off better efficiency for larger electro-magnetic (EM) emissions at harmonics of the desired channel center frequency. As such, these high-power PAs often require mitigation techniques to meet stringent out-of-band emission requirements set by the various regulatory agencies, such as the FCC (Federal Communication Commission) in the United States. These mitigation techniques attempt to minimize cost and power consumption without compromising transmit (TX) efficiency and receive (RX) noise figure and linearity.

For integrated radio front-ends operating in a TDM (Time-Division Multiplexing) radio channel access environment, a solution simultaneously meeting the requirements of both RX and TX paths is difficult to achieve. Conventional techniques rely on off-chip matching networks, such as those shown in FIG. 1 (Prior Art), to filter out unwanted harmonics, and these conventional techniques suffer the drawback of not effectively addressing the EM radiation caused by harmonic currents in the bond wires connecting the integrated circuit (IC) die to the lead-frame within the IC package. In many circumstances, radiation from bond wires, as opposed to antenna radiation, is a dominant source of unwanted out-of-band emissions.

SUMMARY OF THE INVENTION

Systems and methods are disclosed for on-chip harmonic filtering for radio frequency (RF) communications. For disclosed embodiments, a filter circuit is coupled between a first internal node and a connection pad for an integrated circuit. The filter circuit includes a first inductance, a variable capacitance, and a second inductance. The capacitance amount for the variable capacitance is controlled to tune filtering for the filter circuit to a harmonic of a frequency for a transmit output signal. A power amplifier outputs the transmit output signal to the connection pad without passing through the filter circuit. The filter circuit filters the harmonic of the frequency for the transmit output signal, shunting harmonic current to ground. For one embodiment, the filtered harmonic is a third harmonic of the transmit frequency. For one embodiment, the transmit output signal has an output power greater than or equal to 15 dBm. Other features and variations can also be implemented, and related systems and methods can be utilized, as well.

For one embodiment, an integrated circuit is disclosed including a filter circuit coupled between a first node and a connection pad for the integrated circuit, a power amplifier, and a controller. The filter circuit includes a first inductance coupled between the first node and a second node, a variable capacitance coupled between the second node and ground, and a second inductance coupled between the second node and the connection pad. The power amplifier is coupled to provide a transmit output signal to the connection pad without passing through the filter circuit. The controller is coupled to control a capacitance amount for the variable capacitance to tune filtering for the filter circuit to a harmonic of a frequency for the transmit output signal. In further embodiments, the harmonic is a third harmonic of the frequency for the transmit output signal.

In additional embodiments, the integrated circuit also includes a switch coupled between the first node and ground, and the controller is configured to provide a control signal to the switch to cause the switch to be open in a receive mode and closed in a transmit mode. In further embodiments, the integrated circuit includes a low noise amplifier coupled to the first node to receive a receive signal from the filter circuit during receive mode.

In additional embodiments, two separate inductor structures are used to provide the first inductance and the second inductance, or a tapped inductor structure is used to provide the first inductance and the second inductance.

In additional embodiments, the power amplifier is configured to generate output power for the transmit output signal of greater than or equal to 15 dBm. In further additional embodiments, the variable capacitance includes a plurality of capacitors coupled to a plurality of switches that receive control signals from the controller.

For one embodiment, a system is disclosed including an antenna, an integrated circuit having a receive path including a low noise amplifier (LNA) and a transmit path including a power amplifier, one or more bond wires coupled between an on-chip radio frequency (RF) input/output pad for the integrated circuit and an off-chip RF input/output pad coupled to the antenna, a filter circuit within the integrated circuit coupled between the LNA and the on-chip RF input/output pad, and a controller coupled to control a capacitance amount for the variable capacitance. The filter circuit includes a first inductance coupled between the LNA and a second node, a variable capacitance coupled between the second node and ground, and a second inductance coupled between the second node and the on-chip RF input/output pad. The power amplifier is coupled to provide a transmit output signal to the RF input/output pad without passing through the filter circuit. The controller is configured to tune filtering for the filter circuit with respect to a harmonic of a frequency for the transmit output signal. In further embodiments, the harmonic is a third harmonic of the frequency for the transmit output signal.

In additional embodiments, a switch is coupled between ground and a node between the LNA and the first inductance, and the controller is configured to provide a control signal to the switch to cause the switch to be open in a receive mode and closed in a transmit mode.

In additional embodiments, two separate inductor structures are used to provide the first inductance and the second inductance, or a tapped inductor structure is used to provide the first inductance and the second inductance.

In additional embodiments, the power amplifier is configured to generate output power for the transmit output signal of greater than or equal to 15 dBm. In further additional embodiments, the variable capacitance includes a plurality of capacitors coupled to a plurality of switches that receive control signals from the controller.

For one embodiment, a method to operate an integrated circuit is disclosed including providing a filter circuit and a power amplifier within an integrated circuit where the filter circuit is coupled between a first node and a connection pad for the integrated circuit. The filter circuit includes a first inductance coupled between the first node and a second node, a variable capacitance coupled between the second node and ground, and a second inductance coupled between the second node and the connection pad. The method further includes controlling a capacitance amount for the variable capacitance to tune filtering for the filter circuit to a harmonic of a frequency for a transmit output signal output by the power amplifier; outputting, with the power amplifier, the transmit output signal to the connection pad without passing through the filter circuit; and filtering the harmonic of the frequency for the transmit output signal with the filter circuit. In further embodiments, the harmonic is a third harmonic of the frequency for the transmit output signal.

In additional embodiments, the method includes closing a switch to couple the first node to ground in a transmit mode and opening the switch during receive mode to disconnect the first node from ground in a receive mode. In further embodiments, the method includes receiving, with a low noise amplifier, a receive signal from the filter circuit during the receive mode.

In additional embodiments, two separate inductor structures are used to provide the first inductance and the second inductance, or a tapped inductor structure is used to provide the first inductance and the second inductance.

In additional embodiments, the outputting includes generating a transmit output signal having an output power greater than or equal to 15 dBm. In further additional embodiments, the method includes controlling the capacitance amount by adjusting controls signals to a plurality of switches coupled to a plurality of capacitors.

Different or additional features, variations, and embodiments can also be implemented, and related systems and methods can be utilized as well.

DESCRIPTION OF THE DRAWINGS

It is noted that the appended drawings illustrate only example embodiments of the invention and are, therefore, not to be considered limiting of its scope, for the invention may admit to other equally effective embodiments.

DETAILED DESCRIPTION OF THE INVENTION

Systems and methods are disclosed for harmonic filtering for high power radio frequency (RF) communications. For disclosed embodiments, a filter circuit is coupled between a first internal node and a connection pad for an integrated circuit. The filter circuit includes a first inductance, a variable capacitance, and a second inductance. The capacitance amount for the variable capacitance is controlled to tune filtering for the filter circuit to a harmonic of a frequency for a transmit output signal. Various features can be implemented for the embodiments described herein.

Figure 2:
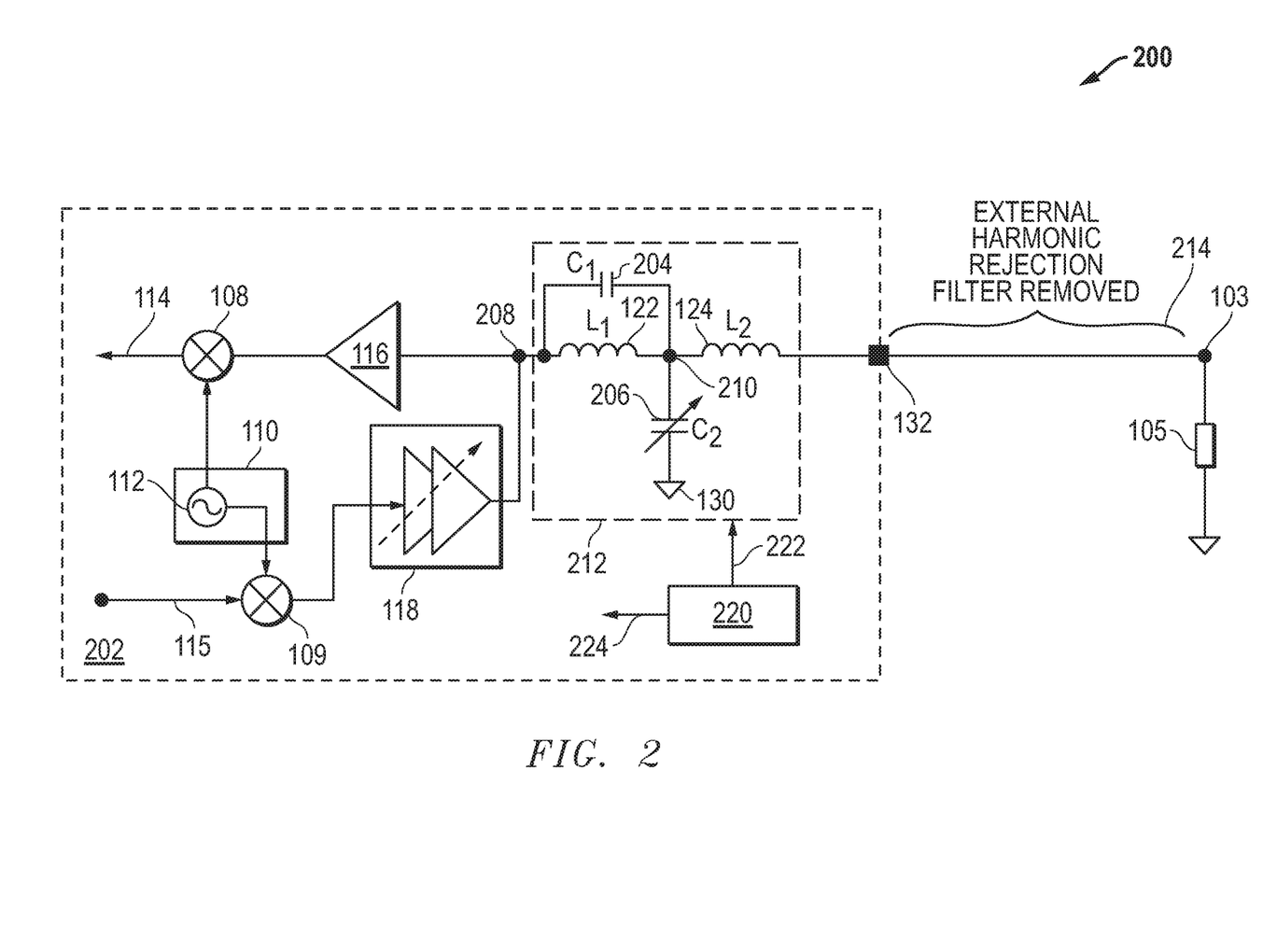
FIG. 2 is a circuit diagram of an example embodiment where a capacitance has been added to a reconfigurable matching network to achieve harmonic rejection filtering as well as impedance matching within a common on-chip filtering and matching circuit.

The disclosed embodiments provide improvements with respect to embodiments shown in FIG. 1 (Prior Art) as well as to embodiments for on-chip harmonic rejection filtering such as those described with respect to FIG. 2. The embodiment of FIG. 2 is also described in co-pending U.S. patent application Ser. No. 16/506,409, filed Jul. 9, 2019, and entitled "ON-CHIP HARMONIC FILTERING FOR RADIO FREQUENCY (RF) COMMUNICATIONS," which is hereby incorporated by reference in its entirety. FIG. 2 is first discussed below. FIGS. 3-4, 5A-5B, and 6 are then discussed and provide example embodiments that achieve significant further advantages particularly for high-power power amplifier solutions and for suppression of unwanted emissions from bond wires leading to off-chip connections.

Looking first to FIG. 2, an embodiment is described that uses additional on-chip capacitances to achieve on-chip tunable harmonic filtering in combination with a reconfigurable on-chip matching network. This on-chip tunable filtering can be used to provide harmonic rejection filtering for RF communications, such as filtering of third harmonics of transmit frequencies. Using the embodiment of FIG. 2, off-chip harmonic filtering can be removed, particularly for low power applications. For high power applications, additional off-chip filtering can be provided due to the limited on-chip quality (Q) factors. Other variations can also be implemented. Further, it is noted that the RF communications as described herein can include communications within one or more frequency bands or related channels at frequencies from about 3 kilohertz (kHz) to 3 GHz or more. For one embodiment, RF communications are made using multiple channels within a 2.4 gigahertz (GHz) frequency band.

FIG. 2 is a circuit diagram of an example embodiment 200 where a capacitance 204 has been added to a reconfigurable matching network to achieve rejection filtering as well as impedance matching within a common filtering and matching circuit 212 for an integrated circuit 202. The example embodiment 200 is similar to example embodiment 100 of FIG. 1 (Prior Art) except that the external harmonic rejection filter 106 has been removed as indicated by bracket 214 and the on-chip capacitance 204 has been added in parallel with the inductance (L1) 122. With the addition of capacitance 204, adjustments to a variable second capacitance (C2) 206 provide tuning for filtering as well as for impedance matching. As such, the additional on-chip first capacitance 204 provides rejection filtering without requiring the off-chip circuitry used in prior solutions. It is again noted, however, that additional off-chip filtering circuitry could be added.

The filtering and matching circuit 212 is configurable based upon a selection of the capacitance amount for the first capacitance (C1) 204 and control of the variable second capacitance (C2) 206. Similar to integrated circuit 102 in FIG. 1 (Prior Art), the integrated circuit 202 of FIG. 2 also includes a receive mixer 108, a low noise amplifier (LNA) 116, a frequency synthesizer 110 including a controlled oscillator 112, a transmit mixer 109, and a power amplifier 118. The connection pad 132 is coupled to an input/output node 103. Although not depicted, a blocking capacitor can also be included between the connection pad 132 and the input/output node 103. The input/output node 103 is coupled to an antenna, which is represented by load 105. One common impedance for an antenna is 50 Ohms, although other antenna impedances can also be used. The integrated circuit 202 includes a receive path and a transmit path. It is also noted that different or additional circuitry could also be included within the integrated circuit 202.

For the receive path, an RF input signal is received at the antenna or load 105 and is provided to connection pad 132. The receive signal then passes through the filtering and matching circuit 212. The impedance matching provided by circuit 212 improves receive signal levels. The filtering provided by circuit 212 typically does not affect signal reception as this filtering is typically tuned to filtering of transmit harmonics such as third harmonics of the transmit frequency. After passing through circuit 212, the receive signal then passes through the low noise amplifier 116 before being down-converted to a lower frequency by the mixer 108. The mixer 108 receives a local-oscillator mixing signal from the on-chip frequency synthesizer 110, which includes the controlled oscillator 112. The down-converted RF input signal 114 is then further processed by circuitry within the integrated circuit 202. For example, the down-converted RF input signal 114 can be converted to digital values by an analog-to-digital converter and then processed by digital processing circuitry within the integrated circuit 202.

For the transmit path, an analog output signal 115 is received by the power amplifier 118 through the transmit mixer 109. This analog output signal 115 can be, for example, an output from a digital-to-analog converter that receives a digital signal generated by digital processing circuitry within the integrated circuit 202. The transmit mixer 109 receives a local-oscillator mixing signal from the on-chip frequency synthesizer 110, which includes the controlled oscillator 112. The transmit mixer 109 up-converts the analog output signal 115 to an RF output signal at a desired transmit frequency. This up-converted RF output signal is provided to power amplifier 118, which can be programmable to generate a transmit output signal at a desired power level. It is also noted that the direct modulation can also be used where the local oscillator signal from frequency synthesizer 110 is modulated with digital or analog transmit data and then fed directly into the power amplifier 118. The transmit output signal is then passed through the filtering and matching circuit 212. As described herein, in addition to providing impedance matching, the circuit 212 operates to filter frequencies within the RF output signal, such as third harmonics of this transmit frequency, based upon the addition of capacitance (C1) 204. The transmit output signal then passes through the connection pad 132 before being transmitted through the antenna or load 105.

For the embodiment depicted, the filtering and matching circuit 212 is implemented using a first inductance 122, a second inductance 124, a first capacitance 204, and a variable second capacitance 206. The first inductance (L1) 122 is coupled between node 208 and node 210, and the second inductance (L2) 124 is coupled between node 210 and the pad 132. The first capacitance (C1) 204 is coupled between nodes 208 and 210 in parallel with the first inductance (L1) 122. The second variable capacitance (C2) 206 is coupled between node 210 and ground 130 and is controlled by controller 220 through one or more control signals 222. The controller 220 can also provide control signals 224 to other circuitry within the integrated circuit 202 and/or to external circuitry.

For the embodiment of FIG. 2, filtering is provided by the addition of the fixed first capacitance (C1) 204. In particular, adding the capacitance (C1) 204 in parallel with the inductance (L1) 122 creates a parallel resonant circuit that can be used to block undesired frequencies, such as the third harmonics of the frequency for the RF transmit signal. For example, where third harmonics are rejected for the output signal 115, these third harmonics circulate only within the power amplifier 118 and do not flow to the off-chip antenna or load 105. The circuit 212 can also filter higher order harmonics. This on-chip filtering provided by the addition of capacitance (C1) 204 in parallel to the inductance (L1) 122 between nodes 208 and 210 creates on-chip filtering that allows removal of the external off-chip harmonic rejection filter 106 of FIG. 1 (Prior Art). Thus, the two to three discrete components that are typically used off-chip to implement the harmonic rejection filter 106 can be removed thereby reducing the cost and size of the resulting RF communication device.

In addition to this filtering, the circuit 212 also provides configurable impedance matching through control of the variable second capacitance (C2) 206. This impedance matching translates the input and/or output impedance to a desirable impedance so that the power amplifier 118 can deliver increased or maximized output power to the antenna or target load 105. It is noted that the impedance matching provided by inductances 122/124 and variable capacitance 206 is similar to the impedance matching described in U.S. Pat. No. 10,141,971, which is hereby incorporated by reference in its entirety.

Adjustments can be made to the variable second capacitance (C2) 206 in FIG. 2 to configure both filtering and matching functions for the integrated circuit 202. For one embodiment, coarse-tune adjustments are made to the variable capacitance (C2) 206 to configure the impedance matching provided by the circuit 212, and fine-tune adjustments are made to the variable capacitance (C2) 206 to configure filtering provided by the circuit 212. Other variations can also be implemented.

It is further noted that values for the first capacitance (C1) 204, the first inductance (L1) 122, the second inductance (L2) 124, and the variable second capacitance (C2) 206 can be selected based upon frequencies to be filtered and impedances to be matched for any particular solution. Magnetic coupling between the inductances 122/124 is one parameter that can be considered in determining these values.

For the embodiment 200 of FIG. 2, harmonic filtering is achieved through the parallel LC resonator formed by inductor (L1) 122 and capacitor (C1) 204, and this LC resonator provides a high impedance for the harmonic current. The variable capacitor (C2) 206 is used to adjust the impedance seen by the power amplifier 118 for impedance matching purposes and, additionally, to allow further tuning of the harmonic filtering provided by the filtering and matching circuit 212. As such, the embodiment 200 has a direct trade-off between attenuation of the harmonic current and loss at fundamental frequency.

This trade-off, however, makes embodiment 200 less suitable for high power applications where an increase in power consumption due to added loss at the fundamental frequency would cause significant performance degradation. For high power applications, it is desirable to achieve high power transmit (TX) outputs with lowest possible supply power consumption.

Figure 3:
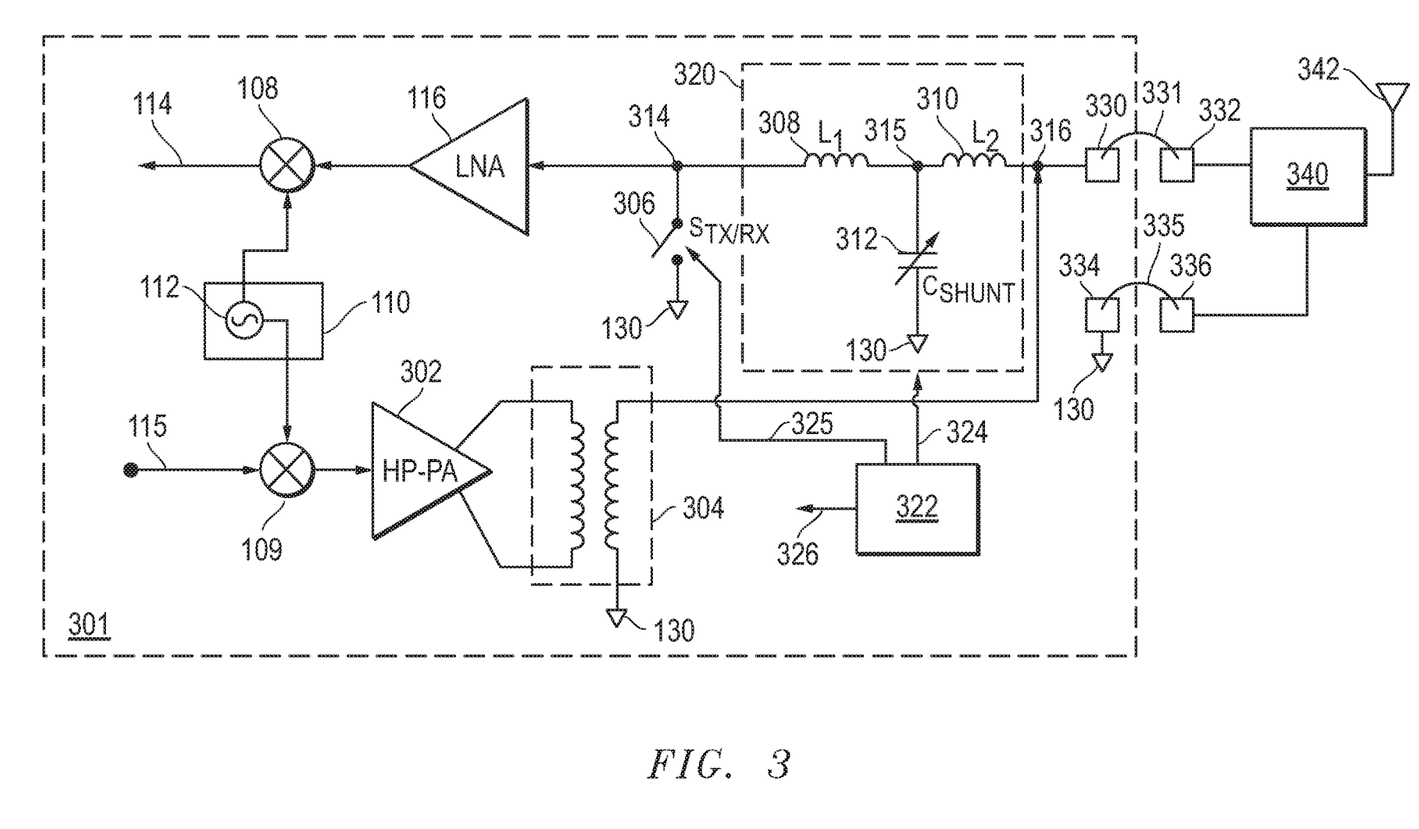
FIG. 3 is a circuit diagram of an example embodiment where filter circuit including a variable capacitance improves out-of-band radiated emission suppression for selected harmonics of the transmitted channel frequency in an integrated RF transceiver, including suppression in bond wires.

Looking now to FIG. 3, a circuit diagram is provided of an example embodiment 300 where a variable shunt capacitance ($C_{SHUNT}$) 312 and related LC filter improves out-of-band radiated emission suppression for selected harmonics of the transmitted channel frequency in an integrated RF transceiver. The embodiment 300 is useful for RF transceivers with high power TX outputs, integrated RF transceivers operating in time-division multiplexing (TDM) medium access schemes, and/or other RF transceiver solutions. Further, the embodiment 300 does not require additional external passive components and can re-use existing on-chip inductors in the receive path circuitry, thereby reducing costs. Additionally, disclosed embodiments do not significantly affect or degrade noise performance and/or linearity performance of the receiver and do not significantly affect or degrade efficiency of the transmitter.

Similar to embodiment 200 in FIG. 2, the integrated circuit 301 of FIG. 3 also includes a receive mixer 108, a low noise amplifier 116, a frequency synthesizer 110 including a controlled oscillator 112, and a transmit mixer 109. For embodiment 300, an on-chip ground pad 334 is coupled to an off-chip ground pad 336 through a bond wire 335. An on-chip RF input/output pad 330 is coupled to an off-chip RF input/output pad 332 through a bond wire 331. The off-chip pads 332/336 are coupled to an external matching network 340, which is in turn coupled to an antenna 342. One common impedance for an antenna is 50 Ohms, although other antenna impedances can also be used. The integrated circuit 301 includes a receive path and a transmit path. It is also noted that different or additional circuitry could also be included within the integrated circuit 301.

For the receive path, an RF input signal is received at the antenna 342, and this RF input signal is then received at off-chip RF input/output pad 332 through the matching network 340. The receive signal then passes through bond wire 331 to the on-chip RF input/output pad 330 before being received by the filter circuit 320. The impedance matching provided by the matching network 340 improves receive signal levels. The filtering provided by filter circuit 320 typically does not affect signal reception as this filtering is tuned to higher frequency filtering of transmit harmonics such as third harmonics of the transmit frequency. For receive modes, the TX/RX switch 306 is open to disconnect node 314 to ground so that the receive signal passes through filter circuit 320 and though node 314 to be received by LNA 116. The receive signal then passes through the low noise amplifier 116 before being down-converted to a lower frequency by the mixer 108. The mixer 108 receives a local-oscillator mixing signal from the on-chip frequency synthesizer 110, which includes the controlled oscillator 112. The down-converted RF input signal 114 is then further processed by additional circuitry within the integrated circuit 202. For example, the down-converted RF input signal 114 can be converted to digital values by an analog-to-digital converter and then processed by digital processing circuitry within the integrated circuit 301. It is noted that additional or different receive path circuitry could also be used while still taking advantage of the techniques described herein.

For the transmit path, an analog output signal 115 is received by the power amplifier 302 through the transmit mixer 109. This analog output signal 115 can be, for example, an output from a digital-to-analog converter that receives a digital signal generated by digital processing circuitry within the integrated circuit 301. The transmit mixer 109 receives a local-oscillator mixing signal from the on-chip frequency synthesizer 110, which includes the controlled oscillator 112. The transmit mixer 109 up-converts the analog output signal 115 to an RF output signal at a desired transmit frequency. This up-converted RF output signal is provided to power amplifier 302, which can be programmable to generate a transmit output signal at a desired power level. It is also noted that the direct modulation can also be used where the local oscillator signal from frequency synthesizer 110 is modulated with digital or analog transmit data and then fed directly into the power amplifier 302. The transmit output signal is then passed through a transformer circuit 304 to the on-chip RF input/output pad 330 through node 316. The transmit output signal then passes through bond wire 331 to off-chip RF input/output pad 332 and ultimately through the matching network 340 to the antenna 342. For transmit modes, the TX/RX switch 306 is closed to connect node 314 to ground. As described herein, the filter circuit 320 operates to filter frequencies within the RF output signal, such as third harmonics of this transmit frequency, based upon tuning provided by the variable capacitance ($C_{SHUNT}$) 312. This filtering in part helps to reduce or eliminate EM transmissions caused by RF signals passing through the bond wires 331/335. It is noted that additional or different transmit path circuitry could also be used while still taking advantage of the techniques described herein.

For the embodiment depicted, the filter circuit 320 is implemented using a first inductance (L1) 310, a second inductance (L2) 308, and a variable shunt capacitance ($C_{SHUNT}$) 312. The first inductance (L1) 308 is coupled between node 314 and node 315, and the second inductance (L2) 310 is coupled between node 315 and node 316. The variable shunt capacitance ($C_{SHUNT}$) 312 is coupled between node 315 and ground 130 and is controlled by controller 322 through one or more control signals 324. For example, the control signals 324 from controller 322 can be used to tune the LC filter formed by variable shunt capacitance ($C_{SHUNT}$) 312 and the second inductance (L2) 310 to third harmonics of the transmit frequency. The controller 322 can also provide a control signal 325 to control the switch 306 so that it is open during receive mode and closed during transmit mode for the integrated circuit 301. The controller 322 can also provide control signals 326 to other circuitry within the integrated circuit 301 and/or to external circuitry.

During transmit operations, the LC filter formed by variable shunt capacitance ($C_{SHUNT}$) 312 and the second inductance (L2) 310 within the filter circuit 320 creates a low impedance path to ground that shunts unwanted harmonic current to the local on-chip ground 130. As such, unwanted harmonic escape currents to the bond wires 331/335 and/or to the antenna 342 are reduce or minimized The variable shunt capacitor ($C_{SHUNT}$) 312 is used to tune the harmonic filtering provided by the filter circuit 320, such as to filter third harmonics of the transmit frequency. The first inductance (L1) 308 can be configured to provide a high impedance at the selected harmonic to be filtered.

The embodiment 300 provides harmonic filtering with reduced or minimal loss of power at the fundamental transmit frequency. As such, the embodiment 300 provides a particularly advantageous solution for high-power (HP) power amplifiers (PA) 302 that have transmit output power greater than or equal to 15 dBm and preferably 20 dBm or more, where dBm is a measure of decibels per milli-watt. Further, for one embodiment, the inductances 308/310 can be implemented by tapping an inductor used for receive-path input matching for the LNA 116. Additional on-chip passive circuits are not required except for the variable shunt capacitor ($C_{SHUNT}$) 312. As such, little additional area is required on chip for embodiment 300. Other variations can also be implemented while still taking advantage of the techniques described herein.

The following TABLE provides example simulation results for third harmonic suppression for ISM (industrial, scientific, and medical) band applications in a frequency range from 2400 megahertz (MHz) to 2483.5 MHz. With the harmonic filter provided by filter circuit 320 as described herein, the harmonic current ($I_{3,BW}$) through the output bond wire 331 is improved by 19 decibels (dB) or more while the reduction of third harmonic power ($P_{3,ant}$) on a 50 Ohms antenna termination is larger than 15 dB.

TABLE

EXAMPLE RESULTS FOR USE OF FILTER CIRCUIT 320

| Embodiment | MN 340 (C1, L, C2) | L2 310 | $C_{SHUNT}$ 312 | $P_{OUT}$ (dBm) | Efficiency (%) | $I_{3,BW}$ (mA) | $P_{3,ant}$ (dBm) |
|---|---|---|---|---|---|---|---|
| FIG. 1 (Prior Art) | 1.5 pF, 3.3 nH, 1.0 pF | NA | NA | 20.7 | 28.9 | 7.0 | −49.1 |
| FIG. 3 | 1.4 pF, 1.9 nH, 1.2 pF | 0.325 nH | 1.5 pF | 20.7 | 29.0 | 1.4 | −63.0 |

For the above TABLE, it is assumed that the matching network (MN) 340 includes a LC network of two capacitors (C1, C2) and one inductor (L). For example, the MN 340 can include an inductor (L) coupled between the antenna 342 and the off-chip RF input/output pad 332, a first capacitor (C1) coupled between the off-chip RF input/output pad 332 and the off-chip ground pad 336, and a second capacitor (C2) coupled between the antenna 342 and the off-chip ground pad 336. The output power ($P_{OUT}$) represents the output from the power amplifier 302 in dBm, which is a representation of decibels per milli-watt. The efficiency represents the percentage of supply power that is provided to the antenna 342. The value $I_{3,BW}$ represents current associated with third harmonics of the transmit frequency that passes through the bond wire 331. The value $P_{3,ant}$ represents the power for third harmonics that are output by the antenna. As seen, the embodiment 300 with filter circuit 320 including the inductance (L2) 310 and the variable shunt capacitance ($C_{SHUNT}$) 312 provides significant reductions to third harmonic currents and power while still maintaining output power at the fundamental frequency and efficiency.

Figure 4:
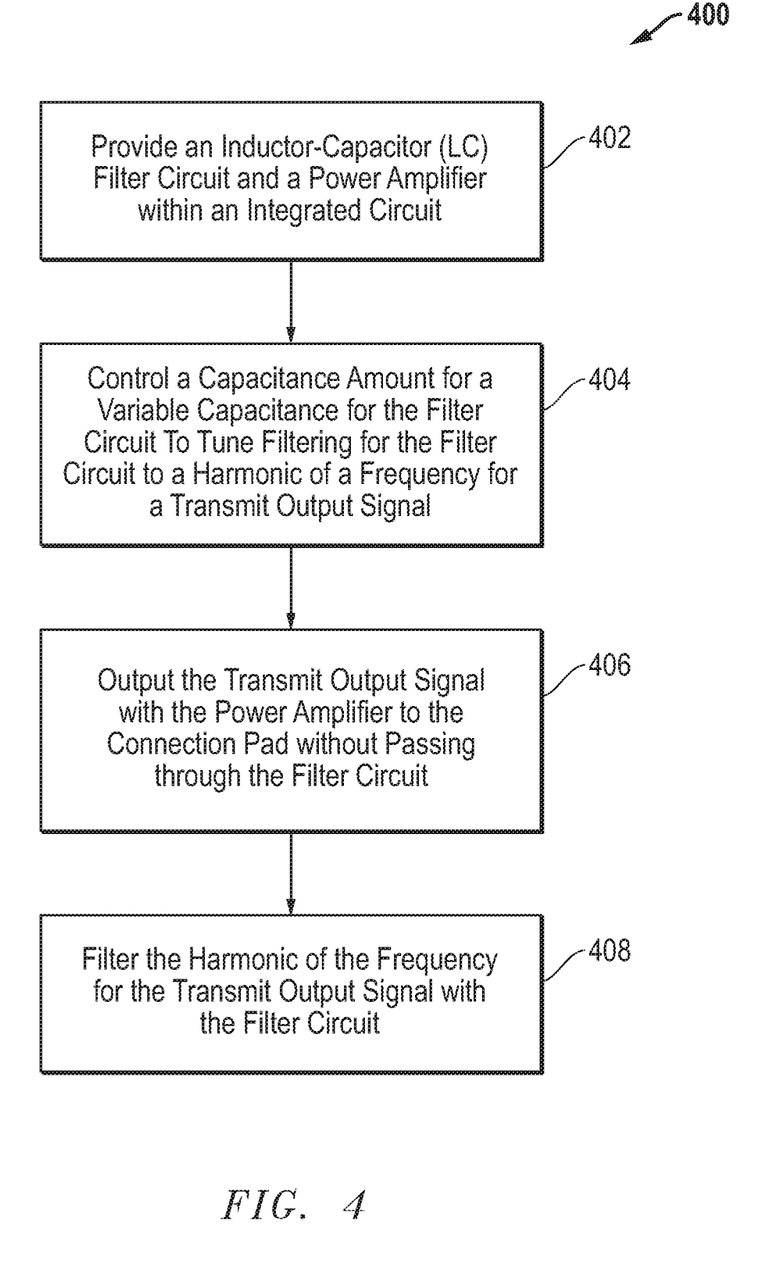
FIG. 4 is process flow diagram of an example embodiment where a variable capacitance within a filter circuit is tuned to filter a harmonic of a frequency for a transmit output signal from a power amplifier and thereby to suppress radiated emissions including those from bond wires.

FIG. 4 is a process flow diagram of an example embodiment 400 where the filter circuit 320 including the variable capacitance 312 is tuned to filter a harmonic of a frequency for a transmit output signal from a power amplifier 302. In block 402, a filter circuit 320 and a power amplifier 302 are provided within an integrated circuit 301. The filter circuit 320 includes the variable shunt capacitance 312 as well as the second inductance (L2) 310 that form an LC resonator that filters the transmit signal from the power amplifier 302. In block 404, the capacitance amount for the variable shunt capacitance 312 is controlled for the filter circuit 320 to tune the filtering provided by the filter circuit 320 to a harmonic of a frequency for a transmit output signal, such as the third harmonic. In block 406, the transmit output signal is output by the power amplifier to the connection pad 330 without passing through the filter circuit 320. In block 408, the harmonic of the frequency for the transmit output signal from the power amplifier is filtered by the filter circuit 320. The filter circuit 320 effectively shunts to ground 130 current associated with the tuned harmonic. It is noted that additional and/or different steps can also be used for embodiment 400 while still taking advantage of the techniques described herein.

Figure 5A:
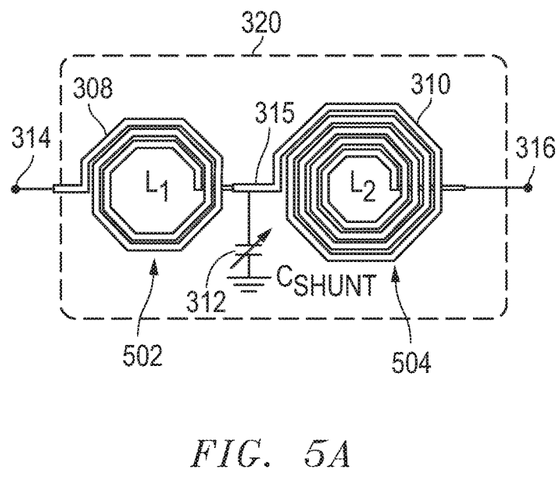
FIG. 5A is a diagram of an example embodiment where the filter circuit is implemented using two separate inductor structures formed within an integrated circuit.

FIG. 5A is a diagram of an example embodiment where the filter circuit 320 is implemented using two separate inductor structures 502 and 504 formed within integrated circuit 301. Inductor structure 502 provides the first inductance (L1) 308, and inductor structure 504 provides the second inductance (L2) 310. The variable shunt capacitance ($C_{SHUNT}$) 312 is coupled to node 315 between the two inductor structures 502 and 504. It is noted that the physical distance between the two inductor structures 502 and 504 is a parameter that affects the resonance frequency for the LC resonator formed by the second inductance (L2) 310 and the variable shunt capacitance ($C_{SHUNT}$) 312.

Although FIG. 5A shows the number of turns for the inductor structure 502 to be smaller than the number of turns for the inductor structure 504, it is further noted that the inductor structure 502 can also be implemented with a larger number of turns than the inductor structure 504 so that the first inductance (L1) 308 is larger than the second inductance (L2) 310. This variation can improve the effectiveness of a filter notch in the frequency domain. For many applications, it is preferable for the impedance provided by the first inductance (L1) 308 through the switch 306 when closed to be large with respect to the LC filter created by the second inductance (L2) 310 and the variable shunt capacitance ($C_{SHUNT}$) 312. Further, the width of the conductive material, such as metal, used to form the inductor structure 504 for the second inductance (L2) 310 can be larger than the width of the conductive material, such as metal, used to form the inductor structure 502 for the first inductance (L1) 508. This variation improves the quality factor for the second inductance (L2) 310. Other variations can also be implemented while still taking advantage of the techniques described herein.

Figure 5B:
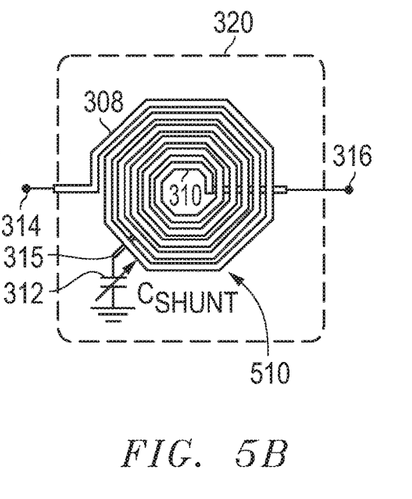
FIG. 5B is a diagram of an example embodiment where the filter circuit is implemented using a single, tapped inductor structure formed within an integrated circuit.
Figure 6:
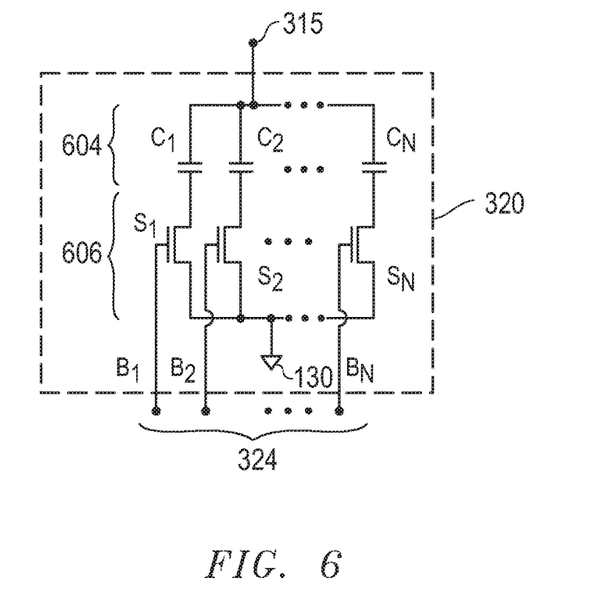
FIG. 6 is a circuit diagram of an example embodiment where the variable capacitance is implemented using multiple capacitors coupled to multiple controlled switches.

FIG. 5B is a diagram of an example embodiment where the circuit 320 is implemented using a single, tapped inductor structure 510 formed within integrated circuit 301. Inductor structure 510 is tapped by variable shunt capacitance ($C_{SHUNT}$) 312 to form two inductor portions. A first coil portion heading back to node 314 provides the first inductance (L1) 308. A second coil portion heading the other direction to node 316 provides the second inductance (L2) 310. Variable shunt capacitance ($C_{SHUNT}$) 312 is coupled between node 315 and ground. Similar to FIG. 5A, the first and second coil portions for the inductor structure 510 can be implemented so that the first inductance (L1) 308 is larger than the second inductance (L2) 310. As also indicated above, the width of the conductive material, such as metal, used to form the second coil portion for the second inductance (L2) 310 can be larger than the width of the conductive material, such as metal, used to form first coil portion for the first inductance (L1) 508. This width change can occur, for example, at the tap point where the node 315 connects to the inductor structure 510. Other variations can also be implemented while still taking advantage of the techniques described herein FIG. 6 is a circuit diagram of an example embodiment for the variable shunt capacitance ($C_{SHUNT}$) 320. For the example embodiment depicted, variable shunt capacitance ($C_{SHUNT}$) 320 includes a plurality of capacitors ($C_1, C_2 \ldots C_N$) 604 coupled to a plurality of switches ($S_1, S_2 \ldots S_N$) 606. The switches ($S_1, S_2 \ldots S_N$) 606 are controlled by a tuning control signal 324 including a plurality of control bits ($B_1, B_2 \ldots B_N$). As indicated above, the tuning control signal 324 is used to tune the harmonic filtering provided by the LC resonator formed by the second inductance (L2) 310 and the variable shunt capacitance ($C_{SHUNT}$) 320. Other variations can also be implemented.

It is noted that the functional blocks, devices, and/or circuitry described herein can be implemented using hardware, software, or a combination of hardware and software. In addition, one or more processing devices (e.g., central processing units (CPUs), controllers, microcontrollers, microprocessors, hardware accelerators, processors, programmable integrated circuitry, FPGAs (field programmable gate arrays), ASICs (application specific integrated circuits), and/or other processing devices) executing software, firmware, and/or other program instructions can be used to implement the disclosed embodiments. It is further understood that one or more of the operations, tasks, functions, or methodologies described herein can be implemented, for example, as software, firmware and/or other program instructions that are embodied in one or more non-transitory tangible computer-readable mediums (e.g., data storage devices, flash memory, random access memory, read only memory, programmable memory devices, reprogrammable storage devices, hard drives, floppy disks, DVDs, CD-ROMs, and/or any other tangible data storage medium) and that are used to program the one or more processing devices (e.g., central processing units (CPUs), controllers, microcontrollers, microprocessors, hardware accelerators, processors, programmable integrated circuitry, FPGAs (field programmable gate arrays), ASICs (application specific integrated circuits), and/or other processing devices) to perform the operations, tasks, functions, or methodologies described herein.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. An integrated circuit, comprising:
a filter circuit coupled between a first node and a connection pad for the integrated circuit, the filter circuit comprising:
  a first inductance coupled between the first node and a second node;
  a variable capacitance coupled between the second node and ground; and
  a second inductance coupled between the second node and the connection pad;
a power amplifier coupled, during a transmit mode, to provide a transmit output signal having a transmit frequency to the connection pad without passing through the filter circuit; and
a controller coupled, during the transmit mode, to control a capacitance amount for the variable capacitance included within the filter circuit, wherein the capacitance amount is controlled by the controller to tune the filter circuit to a harmonic of the transmit frequency of the transmit output signal provided by the power amplifier during the transmit mode; and
wherein the filter circuit filters the harmonic of the transmit frequency from the transmit output signal provided by the power amplifier during the transmit mode by shunting a harmonic current associated with the harmonic of the transmit frequency through the filter circuit to the ground.

2. The integrated circuit of claim 1, wherein the harmonic is a third harmonic of the transmit frequency for the transmit output signal.

3. The integrated circuit of claim 1, further comprising a switch coupled between the first node and ground, and wherein the controller is configured to provide a control signal to the switch to cause the switch to be open in a receive mode and closed in the transmit mode.

4. The integrated circuit of claim 3, further comprising a low noise amplifier coupled to the first node to receive a receive signal from the filter circuit during the receive mode.

5. The integrated circuit of claim 1, wherein two separate inductor structures are used to provide the first inductance and the second inductance, or wherein a tapped inductor structure is used to provide the first inductance and the second inductance.

6. The integrated circuit of claim 1, wherein the power amplifier is configured to generate output power for the transmit output signal of greater than or equal to 15 dBm.

7. The integrated circuit of claim 1, wherein the variable capacitance comprises a plurality of capacitors coupled to a plurality of switches that receive control signals from the controller.

8. A system, comprising:
an antenna;
an integrated circuit having a receive path including a low noise amplifier (LNA) and a transmit path including a power amplifier;
one or more bond wires coupled between an on-chip radio frequency (RF) input/output pad for the integrated circuit and an off-chip RF input/output pad coupled to the antenna;
a filter circuit within the integrated circuit coupled between the LNA and the on-chip RF input/output pad, the filter circuit comprising:
  a first inductance coupled between the LNA and a second node;
  a variable capacitance coupled between the second node and ground; and
  a second inductance coupled between the second node and the on-chip RF input/output pad; and
a controller coupled to control a capacitance amount for the variable capacitance;
wherein the power amplifier is coupled, during a transmit mode, to provide a transmit output signal at a transmit frequency to the RF input/output pad without passing through the filter circuit;
wherein the controller is configured, during the transmit mode, to tune the filter circuit to a harmonic of the transmit frequency of the transmit output signal provided by the power amplifier during the transmit mode; and
wherein the filter circuit filters the harmonic of the transmit frequency from the transmit output signal provided by the power amplifier during the transmit mode by shunting a harmonic current associated with the harmonic of the transmit frequency through the filter circuit to the ground.

9. The system of claim 8, wherein the harmonic is a third harmonic of the transmit frequency of the transmit output signal.

10. The system of claim 8, further comprising a switch coupled between ground and a node between the LNA and the first inductance, and wherein the controller is configured to provide a control signal to the switch to cause the switch to be open in a receive mode and closed in the transmit mode.

11. The system of claim 8, wherein two separate inductor structures are used to provide the first inductance and the second inductance, or wherein a tapped inductor structure is used to provide the first inductance and the second inductance.

12. The system of claim 8, wherein the power amplifier is configured to generate output power for the transmit output signal of greater than or equal to 15 dBm.

13. The system of claim 8, wherein the variable capacitance comprises a plurality of capacitors coupled to a plurality of switches that receive control signals from the controller.

14. A method to operate an integrated circuit, comprising:
providing a filter circuit and a power amplifier within the integrated circuit, the filter circuit being coupled between a first node and a connection pad for the integrated circuit and the filter circuit comprising:
  a first inductance coupled between the first node and a second node;

a variable capacitance coupled between the second node and ground; and a second inductance coupled between the second node and the connection pad;

outputting a transmit output signal at a transmit frequnecy, during a transmit mode, from the power amplifier to the connection pad without passing through the filter circuit;

controlling a capacitance amount for the variable capacitance to tune the filter circuit to a harmonic of the transmit frequency of the transmit output signal output by the power amplifier during the transmit mode; and filtering the harmonic of the transmit frequency from the transmit output signal with the filter circuit by shunting a harmonic current associated with the harmonic of the transmit frequency through the filter circuit to the ground.

15. The method of claim 14, wherein the harmonic is a third harmonic of the transmit frequency of the transmit output signal.

16. The method of claim 14, further comprising closing a switch to couple the first node to ground in the transmit mode and opening the switch to disconnect the first node from ground in a receive mode.

17. The method of claim 16, further comprising receiving, with a low noise amplifier, a receive signal from the filter circuit during the receive mode.

18. The method of claim 14, wherein two separate inductor structures are used to provide the first inductance and the second inductance, or wherein a tapped inductor structure is used to provide the first inductance and the second inductance.

19. The method of claim 14, wherein the outputting comprises generating the transmit output signal having an output power greater than or equal to 15 dBm.

20. The method of claim 14, further comprising controlling the capacitance amount by adjusting controls signals to a plurality of switches coupled to a plurality of capacitors.

* * * * *